US007835205B2

(12) United States Patent
Kim et al.

(10) Patent No.: US 7,835,205 B2
(45) Date of Patent: Nov. 16, 2010

(54) DELAY STAGE-INTERWEAVED ANALOG DLL/PLL

(75) Inventors: Kang Yong Kim, Boise, ID (US); Dong Myung Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 12/252,618

(22) Filed: Oct. 16, 2008

(65) Prior Publication Data

US 2009/0066379 A1 Mar. 12, 2009

Related U.S. Application Data

(62) Division of application No. 11/297,181, filed on Dec. 8, 2005, now Pat. No. 7,447,106, which is a division of application No. 10/893,804, filed on Jul. 19, 2004, now Pat. No. 7,149,145.

(51) Int. Cl.
*G11C 7/00* (2006.01)

(52) U.S. Cl. .................. 365/194; 365/193; 365/233.11; 365/233.1; 327/158; 327/159; 327/141; 327/161; 327/145; 327/149; 327/155; 327/162

(58) Field of Classification Search ................. 365/194, 365/193, 233.1; 327/158, 159, 141, 161, 327/145, 149, 155, 162
See application file for complete search history.

(56) References Cited

U.S. PATENT DOCUMENTS 4,868,522 A * 9/1989 Popat et al. .................... 331/2
4,994,695 A 2/1991 Bazes
5,036,230 A 7/1991 Bazes
5,184,027 A 2/1993 Masuda et al.
5,410,263 A 4/1995 Waizman
5,412,311 A 5/1995 Rothermel (Continued)

FOREIGN PATENT DOCUMENTS

JP 2001-285266 A 10/2001

(Continued)

OTHER PUBLICATIONS

John G. Maneatis, Low-Jitter Process-Independant DLL and PLL Based on Self-Biased Techniques, IEEE Journal, Nov. 1996, 1723-1732, vol. 31, No. 11.

*Primary Examiner*—Viet Q Nguyen
(74) *Attorney, Agent, or Firm*—Dorsey & Whitney LLP

(57) ABSTRACT

A methodology is disclosed that enables the delay stages of an analog delay locked loop (DLL) or phase locked loop (PLL) to be programmed according to the operating condition, which may depend on the frequency of the input reference clock. The resulting optimized delay stages allow for a broad frequency range of operation, fast locking time over a wide range of input clock frequencies, and a lower current consumption at high clock frequencies. Better performance is achieved by allowing the number of analog delay stages active during a given operation to be flexibly set. The deactivation or turning off of unused delay stages conserves power at higher frequencies. The high frequency range of operation is increased by using a flexible number of delay stages for various input clock frequencies. Because of the rules governing abstracts, this abstract should not be used to construe the claims.

14 Claims, 8 Drawing Sheets

U.S. PATENT DOCUMENTS

| | | | | |
|---|---|---|---|---|
| 5,485,490 | A * | 1/1996 | Leung et al. | 375/371 |
| 5,515,403 | A | 5/1996 | Sloan et al. | |
| 5,587,709 | A | 12/1996 | Jeong | |
| 5,610,954 | A | 3/1997 | Miyashita et al. | |
| 5,642,082 | A | 6/1997 | Jefferson | |
| 5,684,421 | A | 11/1997 | Chapman et al. | |
| 5,799,051 | A | 8/1998 | Leung et al. | |
| 5,949,260 | A | 9/1999 | Toda | |
| 5,999,576 | A | 12/1999 | Lee | |
| 6,011,732 | A * | 1/2000 | Harrison et al. | 365/194 |
| 6,069,508 | A * | 5/2000 | Takai | 327/161 |
| 6,073,259 | A | 6/2000 | Sartschev et al. | |
| 6,088,255 | A | 7/2000 | Matsuzaki et al. | |
| 6,125,364 | A | 9/2000 | Greef et al. | |
| 6,157,694 | A | 12/2000 | Larsson | |
| 6,166,572 | A | 12/2000 | Yamaoka | |
| 6,166,990 | A | 12/2000 | Ooishi et al. | |
| 6,198,689 | B1 | 3/2001 | Yamazaki et al. | |
| 6,208,183 | B1 | 3/2001 | Li et al. | |
| 6,211,714 | B1 | 4/2001 | Jeong | |
| 6,232,813 | B1 * | 5/2001 | Lee | 327/278 |
| 6,242,954 | B1 | 6/2001 | Taniguchi et al. | |
| 6,247,138 | B1 | 6/2001 | Tamura et al. | |
| 6,265,918 | B1 | 7/2001 | Toda | |
| 6,304,116 | B1 | 10/2001 | Yoon et al. | |
| 6,310,498 | B1 | 10/2001 | Larsson | |
| 6,317,381 | B1 * | 11/2001 | Gans et al. | 365/233.1 |
| 6,333,660 | B2 | 12/2001 | Taguchi et al. | |
| 6,337,590 | B1 | 1/2002 | Millar | |
| 6,346,839 | B1 | 2/2002 | Mnich | |
| 6,366,148 | B1 | 4/2002 | Kim | |
| 6,369,624 | B1 * | 4/2002 | Wang et al. | 327/156 |
| 6,385,126 | B2 | 5/2002 | Jung et al. | |
| 6,424,193 | B1 * | 7/2002 | Hwang | 327/158 |
| 6,426,662 | B1 | 7/2002 | Arcus | |
| 6,445,231 | B1 * | 9/2002 | Baker et al. | 327/158 |
| 6,459,319 | B2 * | 10/2002 | Sako | 327/276 |
| 6,525,615 | B1 | 2/2003 | Masenas et al. | |
| 6,570,456 | B2 | 5/2003 | Mano et al. | |
| 6,621,314 | B2 | 9/2003 | Krishnamurty | |
| 6,677,791 | B2 | 1/2004 | Okuda et al. | |
| RE38,482 | E | 3/2004 | Leung et al. | |
| 6,768,356 | B1 | 7/2004 | Wu et al. | |
| 6,771,103 | B2 | 8/2004 | Watanabe et al. | |
| 6,774,690 | B2 | 8/2004 | Baker et al. | |
| 6,779,126 | B1 | 8/2004 | Lin et al. | |
| 6,794,912 | B2 | 9/2004 | Hirata et al. | |
| 6,844,761 | B2 | 1/2005 | Byun et al. | |
| 6,845,459 | B2 | 1/2005 | Lin | |
| 6,867,627 | B1 | 3/2005 | Murtagh | |
| 6,912,666 | B2 | 6/2005 | Lin | |
| 6,914,852 | B2 | 7/2005 | Choi | |
| 6,937,076 | B2 | 8/2005 | Gomm | |
| 6,954,511 | B2 | 10/2005 | Tachimori | |
| 6,982,579 | B2 | 1/2006 | Lee | |
| 6,987,409 | B2 * | 1/2006 | Kim et al. | 327/158 |
| 7,010,074 | B2 | 3/2006 | Nakamura | |
| 7,073,098 | B2 | 7/2006 | Kozaki | |
| 7,098,714 | B2 | 8/2006 | Lin | |
| 7,138,845 | B2 * | 11/2006 | Lin | 327/277 |
| 7,149,145 | B2 * | 12/2006 | Kim et al. | 365/189.14 |
| 7,190,755 | B1 | 3/2007 | Sung et al. | |
| 7,242,733 | B2 | 7/2007 | Iwata | |
| 7,271,634 | B1 | 9/2007 | Daga et al. | |
| 7,282,972 | B2 | 10/2007 | Lin | |
| 7,382,678 | B2 * | 6/2008 | Kim et al. | 365/233.1 |
| 7,447,106 | B2 * | 11/2008 | Kim et al. | 365/233.11 |
| 7,489,568 | B2 * | 2/2009 | Kim et al. | 365/189.12 |
| 2002/0180501 | A1 | 12/2002 | Baker et al. | |
| 2004/0125905 | A1 | 7/2004 | Vlasenko et al. | |
| 2005/0050375 | A1 | 3/2005 | Novak et al. | |

FOREIGN PATENT DOCUMENTS

| | | | | |
|---|---|---|---|---|
| JP | 2002094373 | A | * | 3/2002 |

* cited by examiner

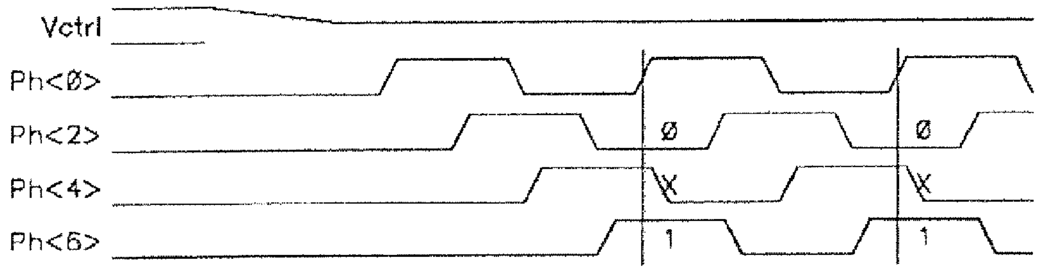
FIG. 6
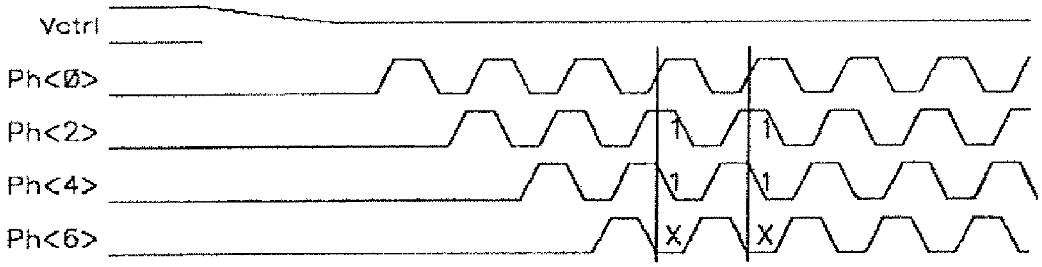
FIG. 7
90
| tD/tCK | 6tD/tCK | 4tD/tCK | 2tD/tCK | Latch 6 | Latch 4 | Latch 2 | FDD 3210 |
|---|---|---|---|---|---|---|---|
| Ø.Ø2 | Ø.12 | Ø.Ø8 | Ø.Ø4 | Ø | Ø | Ø | 1ØØØ None |
| Ø.Ø4 | Ø.24 | Ø.16 | Ø.Ø8 | Ø | Ø | Ø | |
| Ø.Ø6 | Ø.36 | Ø.24 | Ø.12 | Ø | Ø | Ø | |
| Ø.Ø8 | Ø.48 | Ø.32 | Ø.16 | Ø | Ø | Ø | |
| Ø.1Ø | Ø.6Ø | Ø.4Ø | Ø.2Ø | 1 | Ø | Ø | Ø1ØØ Ph<6> |
| Ø.12 | Ø.72 | Ø.48 | Ø.24 | 1 | Ø | Ø | |
| Ø.14 | Ø.84 | Ø.56 | Ø.28 | 1 | 1 | Ø | |
| Ø.16 | Ø.96 | Ø.64 | Ø.32 | 1 | 1 | Ø | |
| Ø.18 | 1.Ø8 | Ø.72 | Ø.36 | Ø | 1 | Ø | ØØ1Ø Ph<4> |
| Ø.2Ø | 1.2Ø | Ø.8Ø | Ø.4Ø | Ø | 1 | Ø | |
| Ø.22 | 1.32 | Ø.88 | Ø.44 | Ø | 1 | Ø | |
| Ø.24 | 1.44 | Ø.96 | Ø.48 | Ø | 1 | Ø | |
| Ø.25 | 1.56 | 1.Ø4 | Ø.52 | 1 | Ø | 1 | |
| Ø.28 | 1.68 | 1.12 | Ø.56 | 1 | Ø | 1 | |
| Ø.3Ø | 1.8Ø | 1.2Ø | Ø.6Ø | 1 | Ø | 1 | |
| Ø.32 | 1.92 | 1.28 | Ø.64 | 1 | Ø | 1 | |
| Ø.34 | 2.Ø4 | 1.36 | Ø.68 | Ø | Ø | 1 | |
| Ø.36 | 2.16 | 1.44 | Ø.72 | Ø | Ø | 1 | |
| Ø.38 | 2.28 | 1.52 | Ø.76 | Ø | 1 | 1 | ØØØ1 Ph<2> |
| Ø.4Ø | 2.4Ø | 1.6Ø | Ø.8Ø | Ø | 1 | 1 | |
| Ø.42 | 2.52 | 1.68 | Ø.84 | 1 | 1 | 1 | |
| Ø.44 | 2.64 | 1.76 | Ø.88 | 1 | 1 | 1 | |
| Ø.46 | 2.76 | 1.84 | Ø.92 | 1 | 1 | 1 | |
| Ø.48 | 2.88 | 1.92 | Ø.96 | 1 | 1 | 1 | |
FIG. 12

DELAY STAGE-INTERWEAVED ANALOG DLL/PLL

CROSS-REFERENCE TO RELATED CASES

This application is a divisional of U.S. application Ser. No. 11/297,181 entitled "Delay Stage-Interweaved Analog DLL/PLL", filed Dec. 8, 2005, and issued as U.S. Pat. No. 7,447,106 on Nov. 4, 2008, which is a divisional of U.S. application Ser. No. 10/893,804 entitled "Delay Stage-Interweaved Analog DLL/PLL" filed Jul. 19, 2004, and issued as U.S. Pat. No. 7,149,145, on Dec. 12, 2006. These applications and patents are incorporated herein by reference for any purpose.

BACKGROUND

1. Field of the Disclosure

The present disclosure generally relates to memory systems and, more particularly, to an analog delay locked loop (DLL) or phase locked loop (PLL) with delay stage interweaving.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the How of commands, data, addresses, etc. into, through and out of the devices.

In SDRAMs or other semiconductor memory devices, it is desirable to have the data output from the memory synchronized with the system clock that also serves a microprocessor. Delay-locked loops (DLLs) are synchronous circuits used in SDRAMs to synchronize an external clock (e.g., the system, clock serving the microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident or has a fixed time delay relationship (or "locked") with the rising edge of a second clock signal (e.g., the memory's internal clock).

FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 14 located outside of chip 12 for electrically connecting the chip 12 to other system devices. Some of those pins 14 may constitute memory address pins or address bus 17, data pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory-chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 20. However, these peripheral devices or circuits are not shown in FIG. 1 for the sake of clarity.

The memory chip 12 may include a plurality of memory cells 20 generally arranged in rows and columns to store data in rows and columns. Each memory cell 20 may store a bit of data. A row decode circuit 22 and a column decode circuit 24 may select the rows and columns in the memory cells 20 in response to decoding an address, provided on the address bus 17. Data to/from the memory cells 20 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) unit 26. The I/O unit 26 may include a number of data output buffers (not shown) to receive the data bits from the memory cells 20 and provide those data bits or data signals to the corresponding data lines in the data bus 18. The I/O unit 26 may further include a clock synchronization unit or delay locked loop (DLL) 28 to synchronize the external system clock (e.g., the clock used by the memory controller (not shown) to clock address, data and control signals between the memory chip 12 and the controller) with the internal clock used by the memory 12 to perform data write/read operations on the memory cells 20. In the embodiment of FIG. 1, the DLL 28 is an analog DLL, which is described in more detail below with reference to FIG. 2.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices connected thereto via the pins 14 on the chip 12. These pins, as mentioned before, may be connected to appropriate address, data and control lines to carry out data transfer (i.e., data transmission and reception) operations.

FIG. 2 depicts a simplified block diagram of the analog delay-locked loop (DLL) 28 shown in FIG. 1. The analog DLL 28 is a 4-phase DLL, generating the Ph0, Ph90, Ph180, and Ph270 signals at its output 33. On the other hand, a 2-phase analog DLL would generate, for example, a Ph0 and a Ph180 signals only. The DLL 28 receives a reference clock (ClkREF) 46 as an input and generates a set of output clock signals (Ph0, Ph90, Ph180, Ph270, Ph360) at the output 33 of a voltage controlled delay line (VCDL) 32. The Ph0 and Ph360 signals are, in turn, fed back into a phase detector 30 whose operation is discussed below. In the discussion herein, the notation. "Ph0" is used to refer to a clock signal that is substantially in phase with the reference clock 46, whereas the "Ph360" signal is substantially 360° out of phase with ClkREF 46. Similarly, the Ph90 clock signal is substantially 90° out of phase with ClkREF 46, the Ph180 clock is substantially 180° out of phase with ClkREF 46, and Ph270 clock is substantially 270° out of phase with the reference clock 46. It is noted that the reference clock 46 is interchangeably referred to herein as "ClkREF", "ClkREF Bitmap," "Ref clock signal". "Ref clock" or "system clock"; whereas each of the various output clocks (Ph0, Ph90, Ph180, etc) is individually referred to herein as a "phase signal" and collectively as "phase signals." The reference clock 46 is typically the external system clock serving the microprocessor (or memory controller) (both not shown) or a delayed/buffered version of the external system clock.

One or more of the output phase signals Ph0, Ph90, etc., or signals derived from them, may be used as "internal clock(s)" by the SDRAM 12 to perform data read/write operations on memory cells 20 and to transfer the data out of the SDRAM to the data requesting device (e.g., a microprocessor (not shown)). As can be seen from FIG. 2, the phase signals are generated using delay lines (not shown) in the VCDL 32, which introduces a specific delay into the input Ref clock 46 to obtain the "lock" condition—i.e., to obtain specific output clocks or phase signals (Ph0, Ph90, etc.) having a predetermined phase relationship with the input reference clock 46. The phase detector (PD) 30 compares the relative timing of the Ph0 and Ph360 phase signals (both of which relate to the reference clock 46 in a determined manner) to generate one of a pair of direction signals—the UP signal 34 or the DN (down) signal 35—depending on the phase difference between the Ph0 and Ph360 signals. The direction signal outputs are fed to a charge pump 36, which generates a control voltage signal Vctrl 38 whose value at a given instant in time depends on the inputs received from the phase detector 30. Thus, the voltage level of the control voltage Vctrl 38 is representative of the phase difference between the Ph0 and Ph360 phase signals and, hence, between the ClkREF signal 46 and its 360° delayed version. The control voltage signal 38 is fed to a bias generator 40, which generates a pair of bias voltage outputs or bias signals—a PMOS (p-channel metal oxide semiconductor) bias voltage VBP 42 and an NMOS (n-channel MOS) bias voltage VBN 43—based on the voltage level of the input Vctrl signal 38. For example, in one embodiment, the PMOS bias voltage VBP may be substantially equal to or may vary directly with Vctrl, the control input to the bias generator. In that case, when the value of Vctrl goes high, the value of VBP goes high whereas the value of VBN goes low. And, when the value of Vctrl goes low, the value of VBP also goes low proportionately whereas the value of VBN goes high.

The bias voltages are applied to the VCDL unit 32 to control the delay imparted therein to the reference clock 46 input thereto. In one embodiment, when VBP goes high and VBN goes low, the delay imparted by VCDL 32 increases; whereas, when VBP goes low and VBN goes high, the delay decreases. Although a single output line 33 is illustrated in FIG. 2, the VCDL 32 may have separate output lines (not shown) to output each of the phase signals Ph0, Ph90, etc., individually. It is noted here that additional constructional details or circuit details (of individual circuit units, e.g., the charge pump 36 or the bias generator 40) for the analog DLL 28 in FIG. 2 is not provided herein for the sake of brevity and also because such details are known to one skilled in the art.

As noted before, the analog DLL 28 in FIG. 2 is a 4-phase DLL, which may be employed when the external or system clock 46 has a frequency (e.g., 800 MHz) that substantially differs from the frequency (e.g., 400 MHz) of the memory's internal clock (not shown). On the other hand, if the internal and external frequencies are almost equal (e.g., both equal to 800 MHz), then a 2-phase DLL (generating only Ph0 and Ph180 outputs) may suffice as is known in the art.

It is observed that the frequency range of operation of the DLL 28 (i.e., the available range of delay) is dependent on the range of Vctrl 38, the gain of various circuit elements in the DLL 28, the number of various VCDL stages constituting the VCDL unit 32, and the PVT (process, voltage, temperature) variations during circuit fabrication and at run time. Generally, if too many VCDL stages (not shown) are used for low frequency operation, the analog DLL 28 requires a lot of current at high frequency because some of those delay stages in VCDL 32 may be unnecessarily kept turned ON during high frequency operation. At high reference clock frequencies, it may not be preferable to increase the number of VCDL stages because that may also increase the corresponding overall delay. However, on the other hand, if less than optimum number of VCDL stages are employed, the VCDL may not properly function at low input clock frequencies. For example, if delay at each VCDL stage (not shown) is in the range of 300-700 ps (picoseconds) (a range of delay is available because of the voltage-controlled nature of the VCDL operation), then four (4) VCDL stages may be needed to obtain a delay range of 1.2 ns-2.8 ns for a low frequency operation. However, with the same number (4) of VCDL stages, it may not be possible to obtain a delay range of 1 ns-4 ns which may be needed to accommodate a higher reference clock frequency (e.g., a frequency having a clock period $t_{CK}$=1 ns). On the other hand, if the number of VCDL stages are reduced to three (3) to obtain the delay range of 0.9 ns-2.1 ns (so as to accommodate the minimum clock period $t_{CK}$ of 1 ns), men the reduced number of delay stages would fail to accommodate lower clock frequencies having periods in the range of 2.1 ns-2.8 ns.

It is noted here that the discussion presented hereinabove equally applies to an analog phase-locked loop (PLL) that may be used in place of the analog DLL 28 in the memory chip 12 as is known in the art. The PLL implementation may include a VCO (Voltage Controlled Oscillator) instead of the VCDL 32 for the DLL version. However, the VCDL and VCO may be generally considered as voltage-controlled frequency monitoring units. Because of substantial similarity in the construction and operation of an analog PLL and an analog DLL, only the DLL implementation is discussed herein. However, it is evident that the entire DLL-related discussion presented herein equally applies to a PLL-based embodiment, of course with suitable PLL-specific modifications as may be apparent to one skilled in the art.

SUMMARY

The inventors have recognized that the frequency range of operation, locking time, and current consumption (e.g., at higher frequencies) of a prior art analog delay locked loop may be negatively affected because of the usage of all delay line stages for all frequencies of operation. Thus, the number of delay stages active in the delay line is fixed regardless of the frequency of the reference clock signal. This arrangement not only consumes extra current (and, hence, power) at higher frequencies of operation, but also results in inefficient and inflexible usage of the delay line. The usage of the entire delay line for each frequency delay operation results in slower looking time and a narrow frequency range of operation. Therefore, the present disclosure contemplates an analog delay locked loop (or phase locked loop) wherein delay stages in a voltage-controlled delay line (or voltage-controlled oscillator) may be programmed according to the operating condition (e.g., the frequency of the input reference clock).

In one embodiment, the present disclosure contemplates a method of operating a synchronous circuit. The method comprises: applying a reference clock as an input to a voltage controlled delay line (VCDL) in the synchronous circuit, wherein the VCDL includes a plurality of delay stages to delay the reference clock input to the VCDL; obtaining a plurality of output signals at an output of the VCDL; and disabling one or more of the plurality of delay stages using a first set of two or more of the plurality of output signals.

In another embodiment, the present disclosure contemplates a method of operating a synchronous circuit, wherein the method comprises; obtaining a reference clock; generating a plurality of output signals, wherein each of the plurality of output signals has a respective phase relationship with the reference clock; and using a first subset of the plurality of output signals to determine which one or more of a plurality of delay stages in the synchronous circuit are to be applied to the reference clock.

In a further embodiment, the present disclosure contemplates another method of operating a synchronous circuit. The method comprises: applying a reference clock as an input to a voltage controlled delay line (VCDL) in the synchronous circuit, wherein the VCDL includes a plurality of delay stages to delay the reference clock input thereto; generating a plurality of output signals at an output of the VCDL, wherein each of the plurality of output signals has a respective phase relationship with the reference clock; and selectively maintaining one or more of the plurality of delay stages activated based on a phase relationship between the reference clock and each output signal in a subset of the plurality of output signals.

The present disclosure also contemplates a synchronous circuit and a system including a memory chip containing the synchronous circuit to perform various method steps outlined above.

The programming of the delay stages according to the operating condition may result in optimized delay stages that allow for broad frequency range of operation, fast locking time over a wide range of input clock frequencies, and a lower current consumption at high clock frequencies. Better performance may be achieved by allowing the number of analog delay stages active during a given operation to be flexibly set. The deactivation or turning off of unused delay stages may conserve power at higher frequencies. The high frequency range of operation may be increased because of the removal of the prior art restriction of using a fixed number of delay stages for all input clock frequencies.

BRIEF DESCRIPTION OF THE DRAWINGS

For the present disclosure to be easily understood and readily practiced, the present disclosure will now be described for purposes of illustration and not limitation, in connection with the following figures, wherein:

FIG. 6 is an exemplary timing diagram illustrating a timing relationship among a set of low frequency output signals and the Vctrl signal in the analog DLL of FIG. 3;

FIG. 7 is an exemplary timing diagram depicting a timing relationship among a set of high frequency output signals and the Vctrl signal in the analog DLL of FIG. 3;

FIG. 12 shows a table listing a set of clock timing ratios and corresponding values of FDD outputs according to one embodiment of the present disclosure.

DETAILED DESCRIPTION

Reference will now be made in detail to certain embodiments of the present disclosure, examples of which are illustrated in the accompanying figures. It is to be understood that the figures and descriptions of the present disclosure included herein illustrate and describe elements that are of particular relevance to the present disclosure, while eliminating, for the sake of clarity, other elements found in typical data storage or memory systems. It is noted at the outset that the terms "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

As noted before, because of substantial similarities (in construction, operation, as well as application) between an analog DLL and an analog PLL (both of which contain voltage-controlled frequency monitoring units as noted hereinbefore), only the DLL implementation is discussed herein. However, it is evident that the entire DLL-related discussion presented herein equally applies to a PLL-based embodiment, of course with suitable PLL-specific modifications as may be apparent to one skilled in the art.

Figure 2:
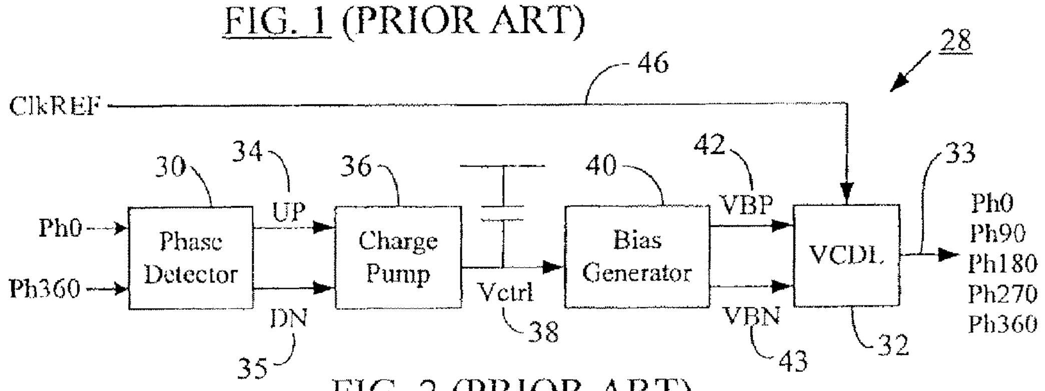
FIG. 2 depicts a simplified block diagram of the analog delay-locked loop (DLL) shown in FIG. 1.
Figure 3:
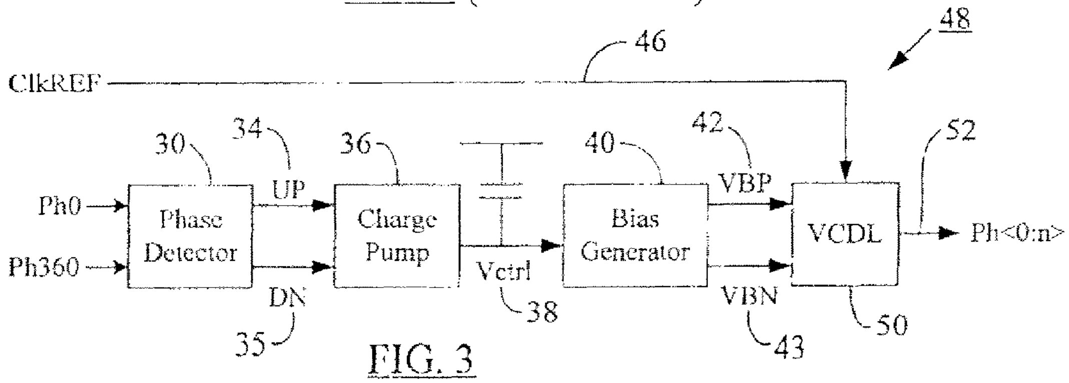
FIG. 3 illustrates an exemplary block diagram of an analog DLL according to one embodiment of the present disclosure.

FIG. 3 illustrates an exemplary block diagram of an analog DLL 48 according to one embodiment of the present disclosure. The DLL 48 may be used in place of the prior art DLL 28 in the memory chip 12. It is noted here that circuit elements that are functionally common between the DLL 28 and the DLL 48 are indicated by the same reference numerals in FIGS. 2 and 3. Thus, upon comparison of FIGS. 2 and 3, it is seen that the DLL 48 contains a voltage-controlled delay line (VCDL) 50 that is functionally different from the VCDL unit 32 in FIG. 2. Although the VCDL unit 50 receives the same reference clock 46 and the same bias signal (which includes a pair of bias voltages VBP 42 and VBN 43) as inputs thereto as in the embodiment of FIG. 2, the generation and usage of output phase signals at the output 52 of VCDL unit 50 is different. The output phase signals Ph<0:n> contain, many more outputs than the 2-phase or 4-phase outputs discussed hereinbefore with reference to FIG. 2. In the embodiment of FIG. 3, the output 52 of VCDL 50 contains n+1 phase signals Ph<0:n>—each corresponding to a different one of the n+1 delay stages (not shown in FIG. 3, but shown in FIG. 4) in the VCDL unit 50. Thus, each delay stage in the VCDL unit 50 generates a corresponding output in the embodiment of FIG. 3, and one or more of such output phase signals Ph<0:n> are used, as discussed later hereinbelow, to generate Ph0 and Ph360 phase signals that are input to the phase detector 30 as already discussed hereinbefore. It is noted here that although a single output line 52 is illustrated in FIG. 3, the output of the VCDL 50 may include n+1 output lines—each carrying a corresponding one of the n+1 phase signals Ph<0:n>. The numeral "52" is used for the sake of clarity to collectively illustrate all such outputs of the VCDL unit 50.

It is observed here that although the functionality of various circuit elements common between the implementations of FIGS. 2 and 3 (e.g., the phase detector 30, the charge pump 36, etc.) may be similar, the circuit element themselves may not be identically constructed. For example, the phase detector 30 in the embodiment of FIG. 3 may have construction different from or may be a modified version of the phase detector 30 in FIG. 2 to accommodate the design and signal considerations that are specific to the DLL 48 embodiment of FIG. 3. For example, the bias generator 40 in FIG. 3 may include a bypass capacitor between VBN line 43 and ground to provide additional stability at high frequency operations. The charge pump 36 in FIG. 3 may be a differential charge pump (to avoid charge sharing) and may also be modified from that in FIG. 2 to include a differential low pass filter for higher DC offset cancellation. Additional modifications to these and other circuit elements in FIG. 3 may also be contemplated depending on the design considerations for the design of the analog DLL 48.

Figure 4:
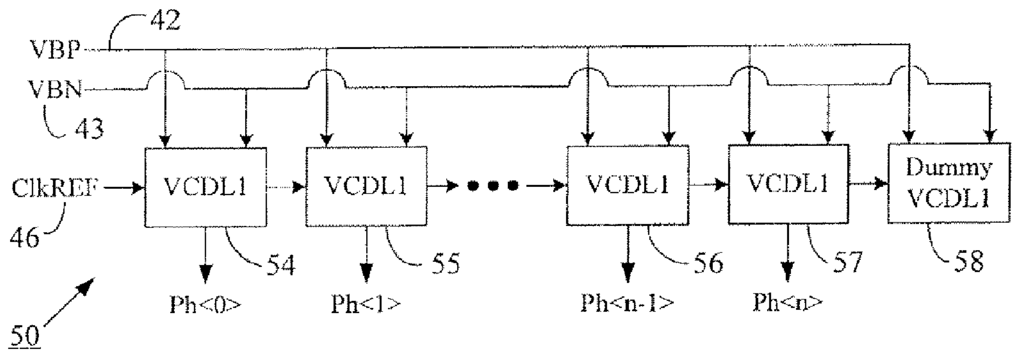
FIG. 4 shows exemplary constructional details of the voltage-controlled delay line (VCDL) used in the analog DLL illustrated in FIG. 3.

FIG. 4 shows exemplary constructional details of the voltage-controlled delay line (VCDL) 50 used in the analog DLL 48 illustrated in FIG. 3. The VCDL 50 in FIG. 3 receives the VBP 42. VBN 43, and ClkREF 46 signals as inputs (similar to the VCDL 32 in FIG. 2), which are connected to each of the delay stages 54-58 constituting the VCDL unit 50 as shown in FIG. 4. However, VCDL 50 selectively applies (as discussed later hereinbelow) one or more of its constituent delay stages 54-58 to the reference clock 46 (based on corresponding Enable signals discussed later hereinbelow with reference to FIG. 9) to generate appropriate output signals—i.e., one or more of the Ph<0:n> outputs are selectively generated depending on the operating condition of VCDL 50. A delay stage 54-58 is considered "applied" to the reference clock 46 (to impart corresponding delay to the reference clock) when that delay stage is turned ON or electrically activated to perform its delay generation, function. Thus, even though the reference clock line 46 is shown connected to each delay stage 54-58 in FIG. 4, one or more of the delay stages 54-58 in FIG. 4 may remain inactive or turned OFF (and, hence, not "applied" to the ClkREF signal 46) depending on the operation condition of VCDL 50 as discussed below.

The selective activation of delay stages in the VCDL 50 of FIGS. 3 and 4 differs from the non-selective usage of all VCDL stages for ail frequencies of operation in the prior art VCDL unit 32 discussed hereinbefore with reference to FIG. 2. The controlled application (or activation) in FIG. 4 of only those VCDL stages 54-58 that are needed for a given reference clock frequency allows for a broader frequency locking range, faster analog DLL locking time, and lower current consumption (and, hence, lower power consumption) at high frequencies.

It is seen from FIG. 4 that each output signal Ph<0>, Ph<1>, . . . , Ph<n> has the same frequency but different phase from the input reference clock 46. That is, each output, signal is a correspondingly delayed version of the reference clock 46, the delay being determined by the position of the delay stage generating the respective output signal. Each delay stage provides one unit of delay (may be denoted as "$t_D$"), which is implied in FIG. 4 by the letters "VCDL1.". Although each delay stage may provide a range of delays (e.g., from 300 ps-700 ps), the unit delay for a given clock reference frequency may have a single value in that range of delays (the value being dependent on the frequency of ClkREF signal 46). In one embodiment, for example, the first delay stage 54 may be configured, not to provide the unit delay to the input reference clock 46. In that case, the Ph<0> output signal would be almost identical to the ClkREf signal 46. However, the second delay stage 55 may provides a unit of delay, and each delay stage thereafter may provide the corresponding unit delay. Thus, although. Ph<0> signal is substantially in phase with ClkREF signal 46, each of the other output signals Ph<1> . . . Ph<n> would be delayed versions of the input Ref clock 46. For example, the Ph<1> output signal will be a unit-delayed version, of ClkREF 46 as compared to the zero delay in Ph<0> output. Similarly, the Ph<n−1> output signal will be an n−1 times (unit) delayed version of the ClkREF signal 46, and so on. Alternatively, each delay stage 54-57 may provide a unit delay. In that ease, the Ph0 signal is a unit-delayed version, of Ref clock 46, the Ph<1> signal is the Ref clock 46 delayed by two unit delays, and so on. It is observed here that a dummy delay stage 58 may be included in the VCDL design to match output loading (i.e., loading at the output of the VCDL unit 32) so as to obtain uniform, unit delays at each delay stage 54-57 in the VCDL unit 32. In the absence of such dummy delay stage 58, the "unit delay" of the first delay stage 54 (or the next delay stage 55) may be more than the "unit delay" of the last delay stage 57, which may not be desirable. It is noted that, in one embodiment, the dummy delay stage 58 may remain "applied" to the input reference clock 46 irrespective of the frequency of the Ref clock 46. That is, the dummy stage 58 may not be selectively turned ON and OFF as are the other delay stages 54-57 (as discussed later hereinbelow). In any event, an output signal (similar to Ph<0>, Ph<1>, etc.) may not be obtained from the dummy delay stage 58 as indicated in FIG. 4.

Figure 5:
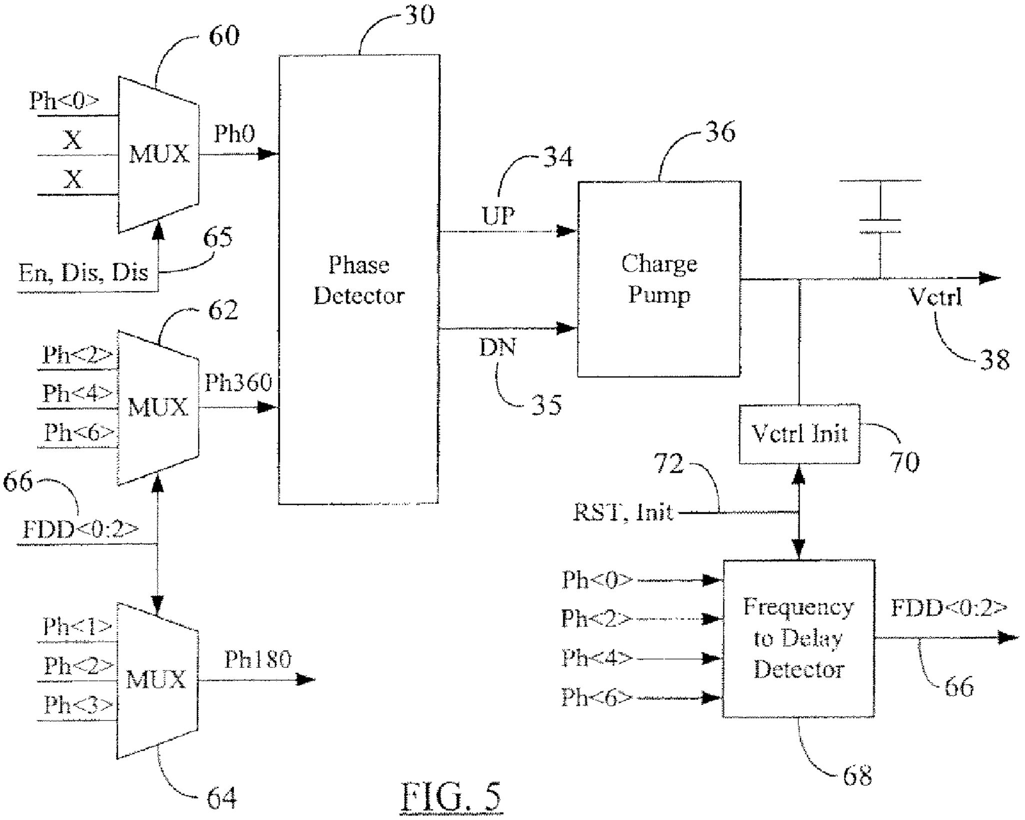
FIG. 5 depicts how respective phase signals are generated and input to the phase detector in a 2-phase analog DLL according to one embodiment of the present disclosure.

FIG. 5 depicts how respective phase signals are generated and input to the phase detector 30 in a 2-phase analog DLL according to one embodiment of the present disclosure. The circuit elements shown in FIG. 5 may be part of the analog DLL 48 in FIG. 3 when the DLL 48 is configured to be operated as a 2-phase DLL. It is noted that only a portion of the analog DLL is shown in FIG. 5, with additional circuit elements (e.g., the bias generator 40 and the VCDL unit 50) omitted for the sake of clarity. In FIG. 5, the RST signal (at line 72), when enabled, resets the analog DLL. On the other hand, when the RST signal is disabled, the Init signal (initialization signal) may be enabled to initialize the Vctrl signal 38 (through a Vctrl Init unit 70) for several clock cycles. The Vctrl initializing circuit (e.g., the Vctrl Init unit 70) may be desirable to obtain better locking speed. With the initialized Vctrl 38 (and with reference clock 46 being applied to the VCDL unit 50), the output phase signals, Ph<0:n>, may be obtained at the output 52 (FIG. 3) of VCDL unit 50. A portion of these initial output signals may be fed to a frequency-to-delay detector (FDD) unit 68. In the embodiment of FIG. 5, during initialization, the FDD unit 68 (discussed in greater detail in conjunction with FIG. 10) is checking the relationship between the frequency of the reference clock 46 (represented by the Ph<0> output signal) and the delayed versions Ph<k> of the reference clock 46 (where k=2, 4, 6, . . . ) to determine the optimized VCDL stages for the given reference clock frequency. In the embodiment of FIG. 5, n=6. Therefore, the FDD unit 68 receives Ph<0>, Ph<2>, Ph<4>, and Ph<6> signals for detection. With the optimized VCDL, the locking time may be fast with a wide range of input (reference) clock frequencies.

It is observed here that, at the time of design of the analog DLL 48, the number ("n") of "active" VCDL delay stages (i.e., the dummy delay stage 58 excluded) may be predetermined depending on various design considerations including, for example, the range of frequencies that may be encountered by the DLL 48 for the input reference clock (the desired locking range), the unit delay that may be obtained at each delay stage (so as to determine the total delay that may be needed to accommodate the range of input clock frequencies), etc. Thus, for example, in the embodiment of FIG. 5, n=6, which means that there are seven (7) "active" delay stages and one dummy delay stage in the VCDL unit of the DLL 48. Although the total number of delay stages are fixed and predetermined at the time of design of the DLL 48, the delay stages in the DLL 48 may be selectively activated (i.e., delay stages that are not required to be applied to the reference clock may be turned OFF or deactivated, for example, to conserve power).

The FDD unit 68 operates on the input phase signals Ph<0>, Ph<2>, Ph<4>, and Ph<6> to generate a set of detection signals FDD<0:2> at its output 66. Again, a single reference numeral "66" is used herein to refer to a group of three separate detection signals for ease of reference only. In practice, in the embodiment of FIG. 5, the output of FDD unit 68 may constitute three separate output lines (not shown in FIG. 5) to carry each corresponding detection signal. The detection signals FDD<0:2> may be applied to a group of multiplexers 62, 64 as control inputs to select an appropriate one of the phase signals input to the multiplexers 62, 64. Thus, in case of the multiplexer 62, one of the phase signals Ph<2>, Ph<4> and Ph<6> may be selected to be applied to the phase detector 30 as the Ph360 input. Whereas, in case of the multiplexer 64, one of the phase signals Ph<1>, Ph<2> and Ph<3> may be selected as the Ph180 output of the DLL 48. Thus, the Ph<0>, Ph<180>, and Ph<360> outputs may be obtained from the DLL 48, more specifically, at output 52 (FIG. 3) of the VCDL unit 50. The Ph0 input of the phase detector 30 is obtained through a multiplexer 60 having a separate Enable (En) and Disable (Dis) signals at its control input 65.

From the above discussion, it is seen that, in the embodiment of FIG. 5, the generation of the phase signals Ph360 and Ph180 depends on a selection of appropriate one of the VCDL output phase signals Ph<1> through Ph<6> for each of the phase signals Ph360 and Ph180. Further, the selection process is controlled by the outputs from the FDD unit 68, which outputs, in turn, are generated based on the detection of phase relation between two or more phase signals output from the VCDL unit 50 as can be seen from the block diagram in FIG. 5. As discussed with reference to FIG. 9, unneeded or unused VCDL stages may be disabled with outputs from the FDD unit (e.g., FDD<0:2> in FIG. 5) to save current. An exemplary circuit layout for an FDD unit to generate various FDD outputs is illustrated in FIG. 10.

FIG. 6 is an exemplary timing diagram illustrating a timing relationship among a set of low frequency output signals and the Vctrl signal 38 in the analog DLL 48 of FIG. 3. In FIG. 6, the input reference clock is a low frequency signal, resulting in low frequency phase output signals from the VCDL unit 50. An even numbered phase output signals (Ph<k>, k=0, 2, 4, 6) are illustrated in FIG. 6. As discussed hereinbefore with reference to FIG. 5, these output signals are also fed into the FDD unit 68 to detect the phase relationship between the reference clock (the Ph<0> signal) and all other delayed versions thereof (i.e., Ph<2>, Ph<4> and Ph<6> signals in FIGS. 5 and 6). The "high" (logic "1") and "low" (logic "0") values for different signals are also indicated with reference to specific instants in time. The waveform for the Vctrl signal 38 over time is also depicted for the reference. Based on the timing relationship depicted in FIG. 6 among the phase signals Ph<0>, Ph<2>, Ph<4>, and Ph<6>, it is seen that the FDD unit 68 may be configured to select (through appropriate logic value on each of the FDD output FDD<0:2> controlling the multiplexers 62 and 64 shown in FIG. 5) either of the Ph<4> and Ph<6> signals to function as the Ph360 input to the phase detector 30 (FIG. 5), whereas either of the Ph<2> and Ph<3> (not shown in FIG. 6) signals may be selected to function as the Ph180 signal (FIG. 5).

FIG. 7 is an exemplary timing diagram depicting a timing relationship among a set of high frequency output signals and the Vctrl signal 38 in the analog DLL 48 of FIG. 3. In contrast to the waveforms in FIG. 6, the input reference clock in the embodiment of FIG. 7 is a higher frequency signal, resulting in high frequency phase output signals from the VCDL unit 50 (as can be seen from a simple visual comparison of the period of phase signals in FIGS. 6 and 7). As in FIG. 6, even numbered phase output signals (Ph<k>, k–0, 2, 4, 6) are illustrated in FIG. 7. The "high" (logic "1") and "low" (logic "0") values for different signals are also indicated with reference to specific instants in time. The waveform for the Vctrl signal 38 over time is also depicted for the reference. Based on the liming relationship depicted in FIG. 7 among the phase signals Ph<0>, Ph<2>, Ph<4>, and Ph<6>, it is seen that the FDD unit 68 may be configured to select either of the Ph<2> and Ph<4> signals to function as the Ph360 input to the phase detector 30 (FIG. 5), whereas either of the Ph<2> and Ph<1> (not shown in FIG. 7) signals may be selected to function as the Ph180 signal (FIG. 5).

Figure 8:
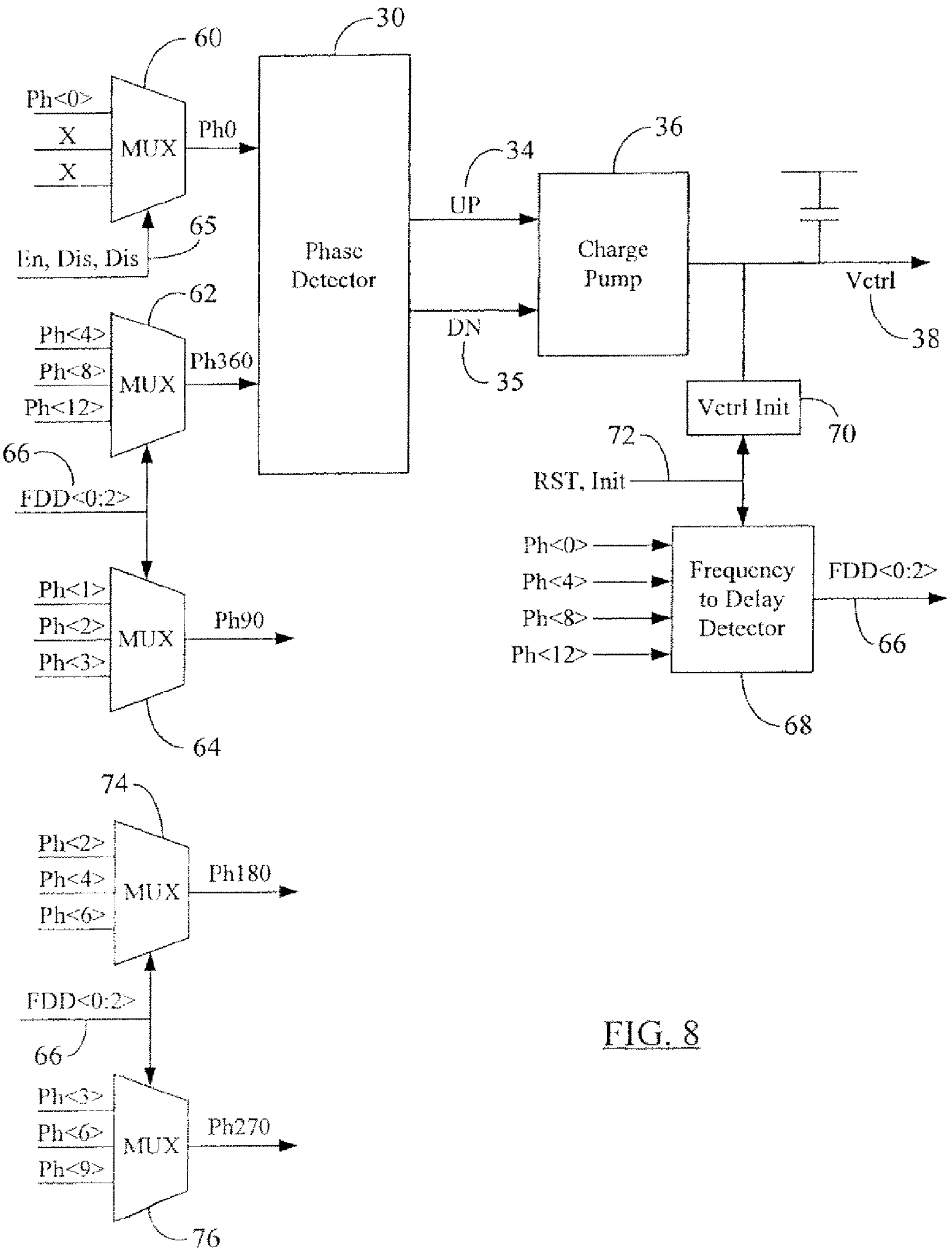
FIG. 8 depicts how respective phase signals are generated and input to the phase detector in a 4-phase analog DLL according to one embodiment of the present disclosure.

FIG. 8 depicts how respective phase signals are generated and input to the phase detector 30 in a 4-phase analog DLL according to one embodiment of the present disclosure. The circuit elements shown in FIG. 8 may be part of the analog DLL 48 in FIG. 3 when the DLL 48 is configured to be operated as a 4-phase DLL (i.e., having Ph0, Ph90, Ph180, and Ph270 outputs, in addition to the Ph360 output). A comparison of the embodiments in FIGS. 5 and 8 shows the substantial similarities between the two block diagrams. However, there are several noticeable differences between FIGS. 5 and 8: (1) In FIG. 8, two additional multiplexers 74 and 76 are provided to generate outputs Ph180 and Ph270), (2) the phase signals (output from the delay stages in the VCDL unit 50) selected as inputs to the FDD unit 68 in FIG. 8 are different from those in FIG. 5, (3) the phase signals input to multiplexers 62, 64 in FIG. 8 are different from those in FIG. 5, (4) the multiplexer 64 in FIG. 8 generates the Ph90 output as opposed to the Ph180 output in the embodiment of FIG. 5, and (5) in the embodiment of FIG. 8, n=12 (i.e., the VCDL unit 50 in the analog DLL 48 includes 13 delay stages generating output signals Ph<0> through Ph<12> and a dummy delay stage). Despite these differences, the construction and operation of the exemplary circuit configuration in FIG. 8 is substantially similar to the exemplary configuration in FIG. 5 and, hence, no additional discussion of the diagram in FIG. 8 is provided herein.

Figure 9:
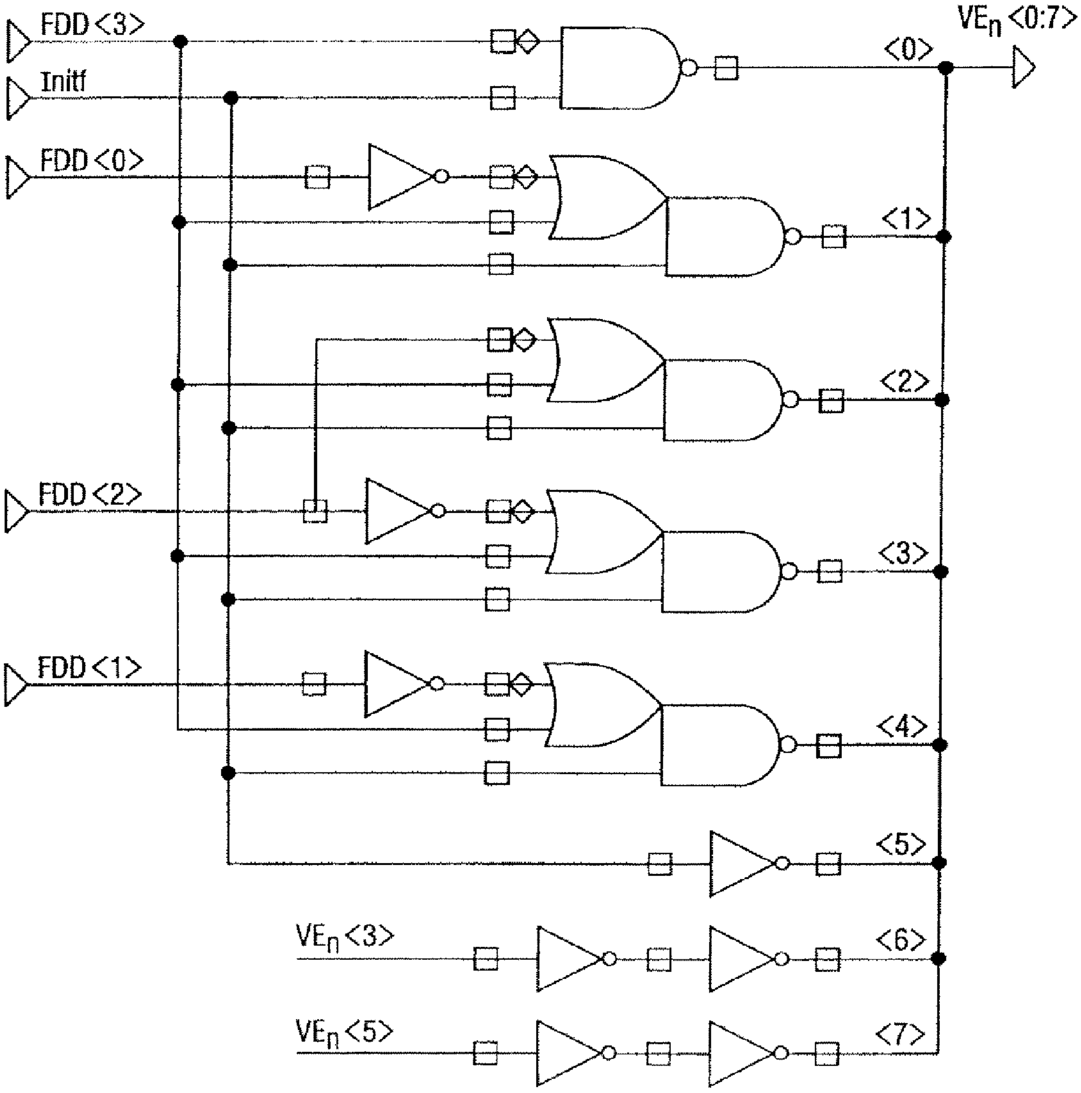
FIG. 9 is an exemplary circuit layout illustrating how eight enable signals may be generated using outputs from a frequency to delay detector (FDD) to enable/disable each delay stage in a VCDL according to one embodiment having eight delay stages.
Figure 10:
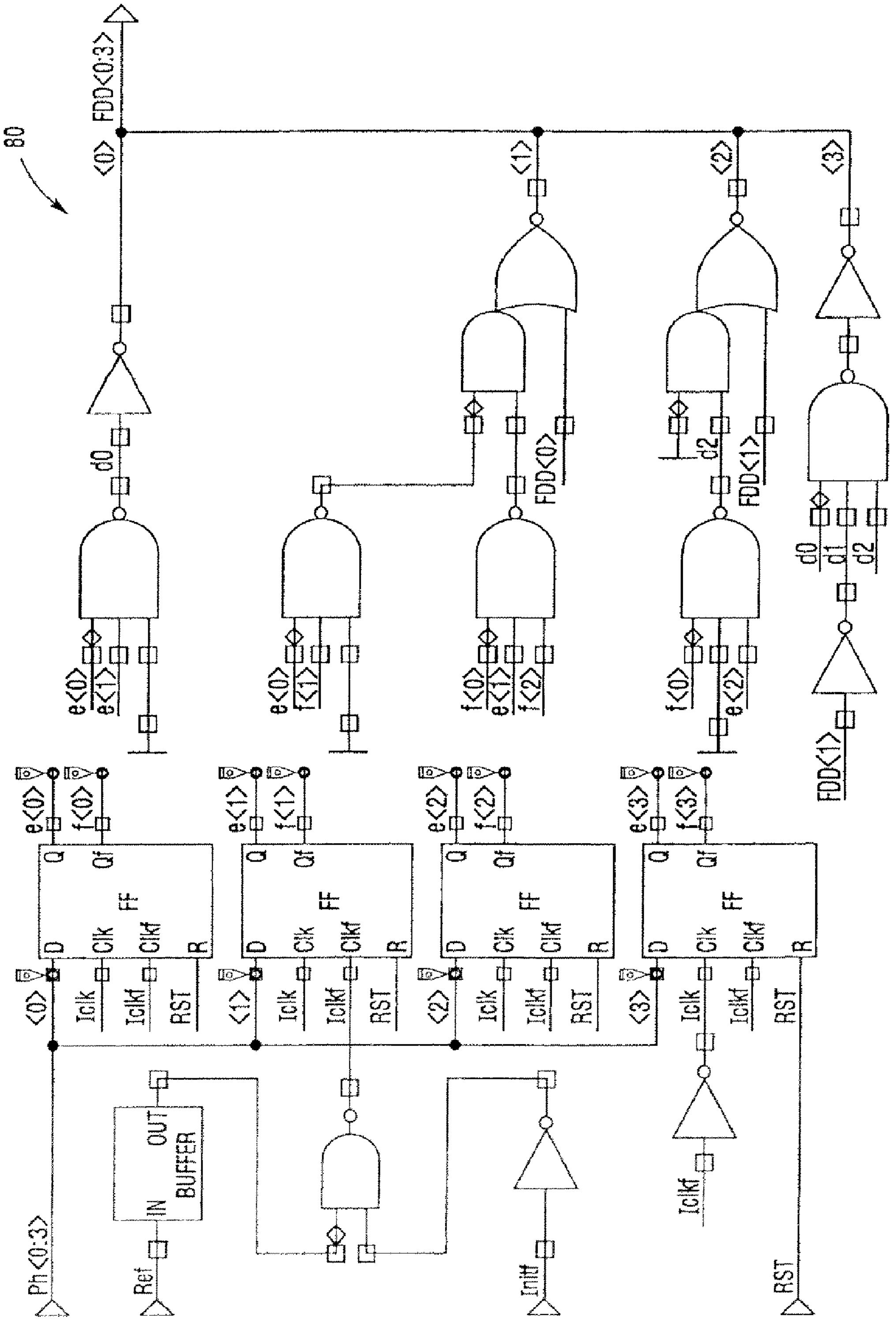
FIG. 10 shows an exemplary circuit layout of an FDD according to one embodiment of the present disclosure.

FIG. 9 is an exemplary circuit layout illustrating how eight enable signals VEn<0:7> may be generated using outputs FDD <0:3> from an FDD unit (similar to the FDD unit 68 in FIG. 5 or 8) to enable/disable each delay stage in a VCDL according to one embodiment having eight delay stages (e.g., the VCDL 50 in FIG. 4 with n=7). In the circuit configuration of FIG. 9, the outputs of the FDD unit are shown individually as inputs FDD<0>, FDD<1>, FDD<2> and FDD<3>, which generate eight enable signals collectively designated in FIG. 9 as signals VEn <0:7> (although each VEn signal may be output over a separate output line as is known in the art). Each enable signal may be applied to a corresponding VCDL delay stage. For example, the VEn<0> signal may be applied to the first delay stage (e.g., the delay stage 54 in FIG. 4), the VEn<1> signal may be applied to the second delay stage (e.g., the delay stage 55 in FIG. 4), and so on. Thus, it is seen from the circuit configuration in FIG. 9, that the enable signals VEn may be used to activate/deactivate individual delay stages in the VCDL unit 50. For example, assuming a range of 1 ns to 4 ns clock periods for the input reference clock 46 (i.e., $t_{CK}$=clock period of the reference clock=1 ns-4 ns) and further assuming that the analog DLL 48 incorporating the VCDL unit 50 receiving such a range of clock frequencies is designed to have eight (8) VCDL stages (n=7) to provide a delay equal to the maximum clock period of 4 ns, then in the event that the input reference clock period is 2 ns ($t_{CK}$=2 ns. i.e., a higher clock frequency), the VEn<4:7> outputs may be used to disable those four delay stages in the VCDL unit 50 that generate the output signals Ph<4:7> whereas VEn<0:3> may be used to enable or activate delay stages corresponding to output signals Ph<0:3> (because n=8). Similarly, if the input clock has a still higher frequency (e.g., $t_{CK}$=1 ns), then VEn<2:7> signals may be used to disable those six (6) delay stages in the VCDL unit 50 that generate the output signals Ph<2:7> whereas VEn<0:1> may be used to enable respective outputs Ph<0:1>, and so on. Thus, selective activation and deactivation of VCDL delay stages (to accommodate higher and lower frequency input reference clocks) may be accomplished with VEn signals, which may be generated using the outputs from an FDD unit (e.g., the FDD unit 68 in FIG. 5 or 8) as depicted in the exemplary circuit of FIG. 9.

As another example of utility of selective activation/deactivation of delay stages, it is assumed, as before in the discussion with reference to FIG. 2, that each delay stage 54-57 in the VCDL unit 50 provides a delay in the range of 300 ps-700 ps. Thus, if the analog DLL 48 (FIG. 3) is designed with four such delay stages in its VCDL unit 50, then all four stages, when active, may provide a delay in the range of 1.2 ns-2.8 ns. However, this range of delay may not accommodate input reference clock frequency of 1 ns when all four of the delay stages are turned ON (as in ease of the prior art DLL 28 in FIG. 2). Further, once the analog DLL 48 is designed, it may not be possible to add or remove delay stages from its VCDL unit 50 during run time. In that event, appropriate VEn signals according to the teachings of the present disclosure may be used to deactivate one of the four delay stages while keeping the first three delay stages active or turned ON so as to achieve a delay range of 0.9 ns-2.1 ns, which would not only accommodate the higher input clock frequency ($t_{CK}$=1 ns) but would also lower current consumption at higher frequencies (because of deactivation of one or more delay stages). Thus, VEn signals may be used in this manner to control the number of delay stages that may be active in the VCDL unit 50 at any given time, thereby allowing the DLL 48 to operate with a broader input reference clock frequency range.

FIG. 10 shows an exemplary circuit layout of an FDD 80 according to one embodiment, of the present disclosure. In the embodiment of FIG. 10, the FDD 80 receives four phase signals Ph<0:3> (outputs of the corresponding VCDL unit, e.g., the VCDL unit 50 with n=3) and also generates four output signals FDD<0:3>. The RST and Initf signals are similar to the RST and Init signals, respectively, shown in FIGS. 5 and 8. The FDD 80 in FIG. 10 is also shown to receive the reference clock as the Ref input. Other signals shown in FIG. 10 are generated internal to the FDD 80 and are self-explanatory in view of the circuit configuration in FIG. 10.

Figure 11:
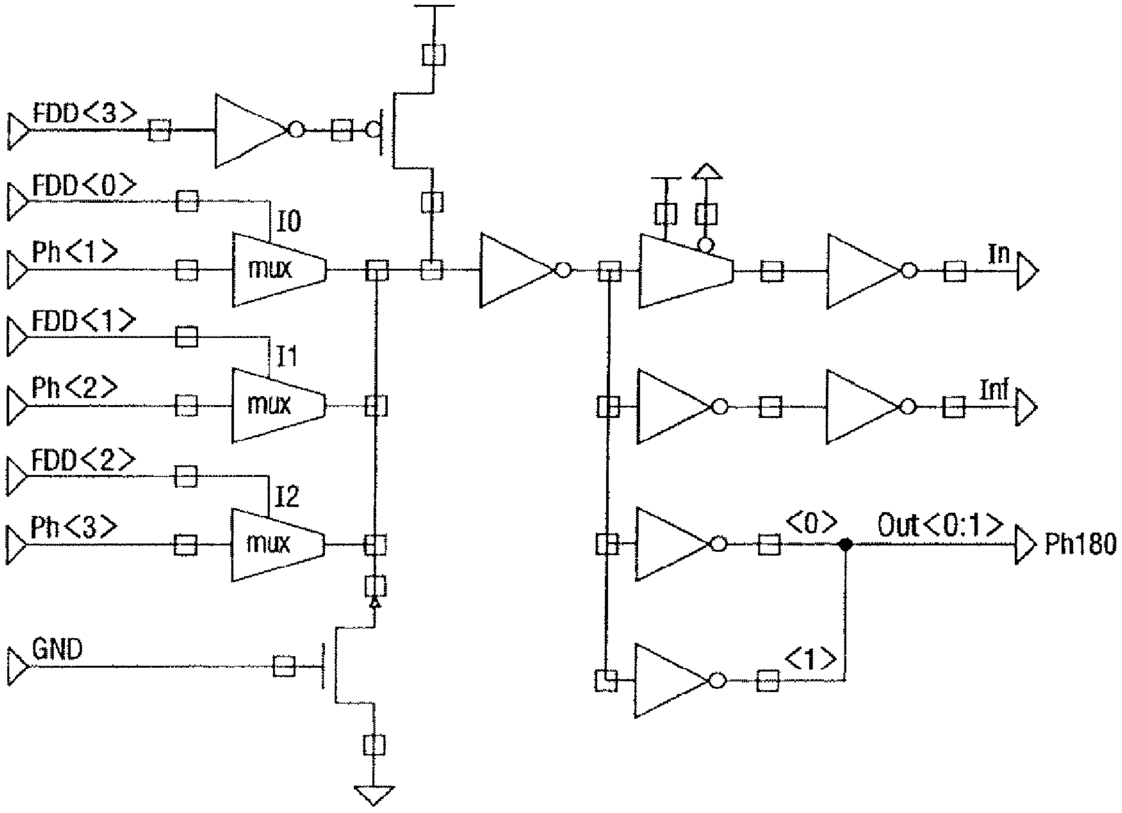
FIG. 11 depicts an exemplary circuit layout according to one embodiment of present disclosure showing how a Ph180 phase signal may be generated using outputs of an FDD.

FIG. 11 depicts an exemplary circuit layout according to one embodiment of present disclosure showing how a Ph180 phase signal may be generated using outputs of an FDD (e.g., the outputs FDD<0:3> of the FDD 80 in FIG. 10). A circuit configuration similar to the one shown in FIG. 11 may be used to generate the Ph180 signal in the configurations of FIGS. 5 and 8. Because of the self-explanatory nature of the circuit layout in FIG. 11, no further discussion of FIG. 11 is provided herein.

FIG. 12 shows a table 90 listing a set of clock timing ratios and corresponding values of FDD outputs (FDD<0:3>) according to one embodiment of the present disclosure. In the table 90, the terms "$t_D$" and "$t_{CK}$" have the meanings attributed to them hereinbefore. Thus, the term "$t_D$" denotes a unit delay of a single delay stage in a VCDL unit (e.g., the VCDL unit 50 in FIG. 4) whereas the term "$t_{CK}$" denotes the clock period of the input reference clock 46. Referring now to FIG. 10, it is seen that there are four flip-flops receiving the Ph<0:3> input lines. These flip-flops are referred to by the term "Latch" in the second column from right, in table 90. Thus. "Latch 2" refers to that flip-flop in FIG. 10 which receives Ph<2> signal as input and generates the e<0> output signal related to the $2t_D/t_{CK}$ timing ratio (represented by the Ph<2> signal). Similarly, "Latch 4" refers to that flip-flop in FIG. 10 which receives Ph<4> signal as input and generates the e<1> output signal related to the $4t_D/t_{CK}$ timing ratio (represented by the Ph<4> signal). And, the "Latch 6" entry under the "Latch" column in table 90 refers to that flip-flop in FIG. 10 which receives Ph<6> signal as input and generates the e<2> output signal related to the $6t_D/t_{CK}$ timing ratio (represented by the Ph<6> signal). The fourth flip-flop in FIG. 10 (which generates the e<3> output signal) may receive the Ph<0> signal as input. It is noted here that the actual signal inputs Ph<2>, Ph<4>, Ph<6> and Ph<0> in FIG. 10 are designated as Ph<0:3> input lines, respectively, at the top left-hand corner in FIG. 10.

Figure 13:
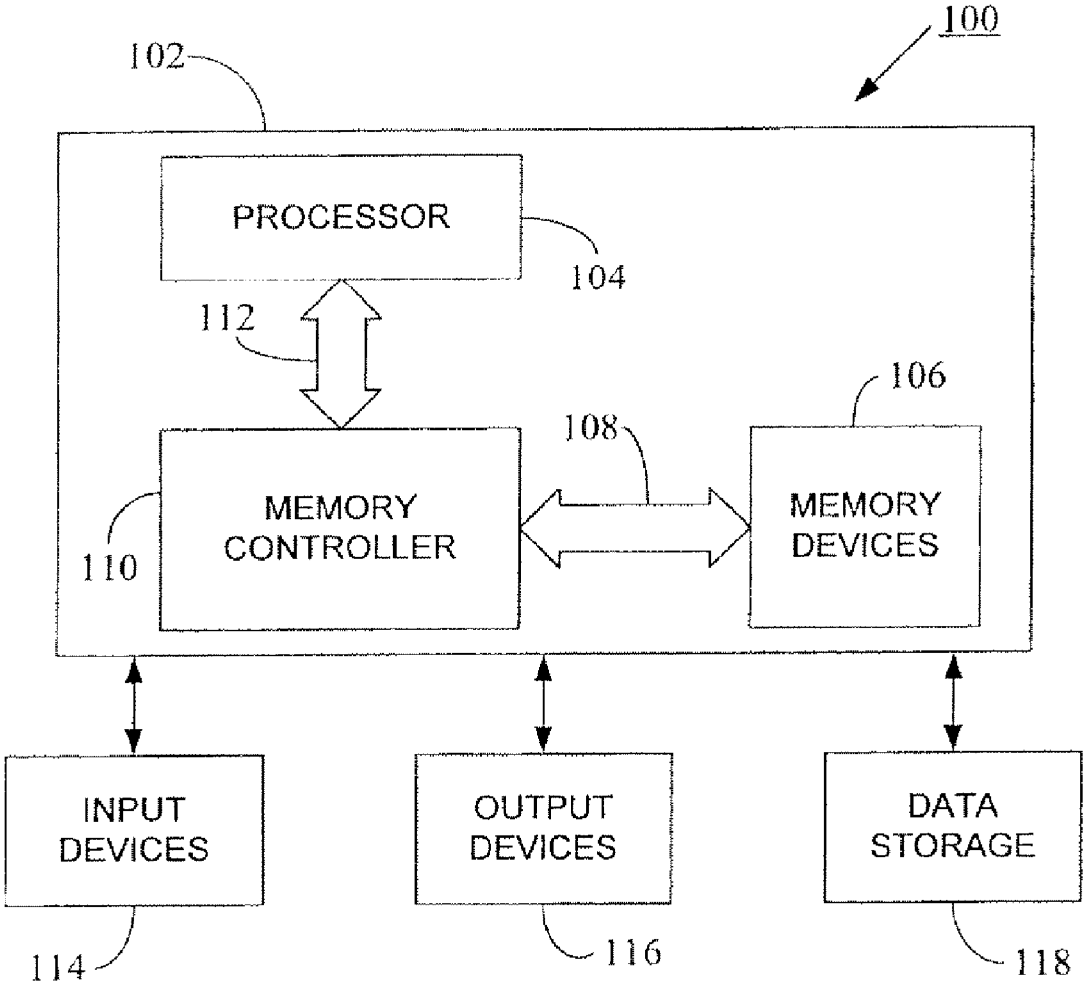
FIG. 13 is a block diagram depicting a system in which the analog DLL of FIG. 3 may be used.

FIG. 13 is a block diagram depicting a system 100 in which the analog DLL 48 of FIG. 3 may be used. The system 100 may include a data processing unit or computing unit 102 that includes a processor 104 for performing various computing functions, such as executing specific software to perform specific calculations or data processing tasks. The computing unit 102 may also include memory devices 106 that are in communication with the processor 104 through a bus 108. The bus 108 may include an address bus (not shown), a data bus (not shown), and a control bus (not shown). Each of the memory device 106 can be a dynamic random access memory (DRAM) chip or another type of memory circuits such as SRAM (Static Random Access Memory) chip or Flash memory. Furthermore, the DRAM could be a synchronous DRAM, commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. Those of ordinary skill in the art will readily recognize that a memory device 106 of FIG. 13 is simplified to illustrate one embodiment of a memory device and is not intended to be a detailed illustration of all of the features of a typical memory chip. The processor 104 can perform a plurality of functions based on information and data stored in the memory devices 106. The processor 104 can be a microprocessor, digital signal processor, embedded processor, micro-controller, dedicated memory test chip, or the like.

Figure 1:
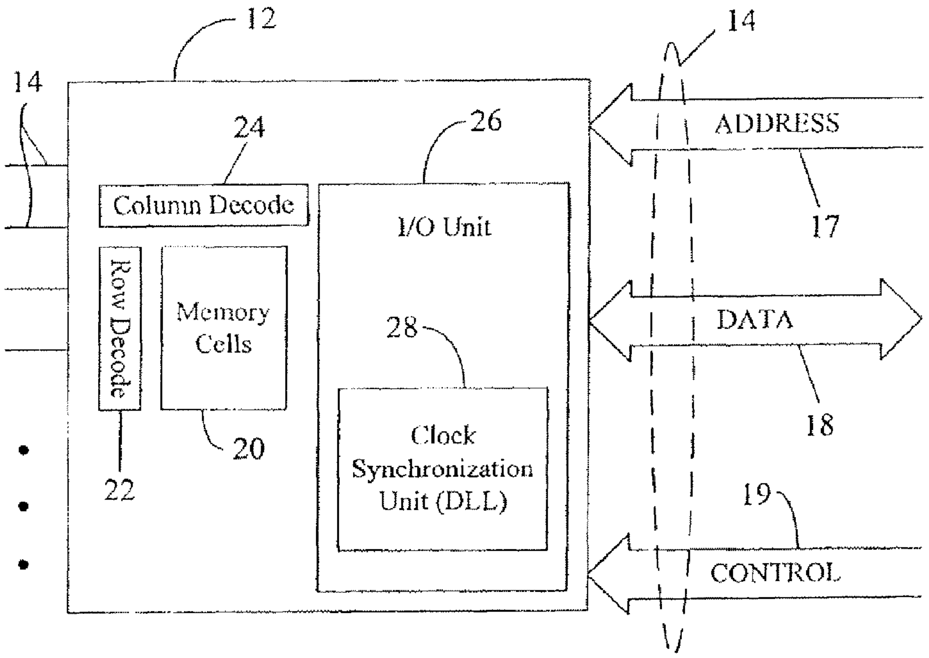
FIG. 1 is a simplified block diagram showing a memory chip or memory device.

Each of the memory devices 106 may have construction similar to that shown in FIG. 1, with the exception that the DLL unit 28 of the prior art is replaced by the analog DLL 48 (FIG. 3) according to one embodiment of the present disclosure. A memory controller 110 controls data communication to and from the memory devices 106 in response to control signals (not shown) received from the processor 104 over the bus 112. The memory controller 110 may include a command decode circuit (not shown). The command decode circuit may receive the input control signals (on the bus 112) (not shown) to determine the modes of operation of one or more of the memory devices 106. Some examples of the input signals or control signals (not shown in FIG. 13) on the bus 112 (and also on the bus 108) include an External Clock signal, a Chip Select signal, a Row Access Strobe signal, a Column Access Strobe signal, a Write Enable signal, etc.

The system 100 may include one or more input devices 114 (e.g., a keyboard, a mouse, etc.) connected to the computing unit 102 to allow a user to manually input data, instructions, etc., to operate the computing unit 102. One or more output devices 136 connected to the computing unit 102 may also be provided as part of the system 100 to display or otherwise output data generated by the processor 104. Examples of output devices 116 include printers, video terminals or video display units (VDUs). In one embodiment, the system 100 also includes one or more data storage devices 118 connected to the data processing unit 102 to allow the processor 104 to store data in or retrieve data from internal or external storage media (not shown). Examples of typical data storage devices 118 include drives that accept hard and floppy disks, CD-ROMs (compact disk read-only memories), and tape cassettes.

It is noted that the analog DLL 48 according to one embodiment of the present disclosure may receive reference clock frequencies in the range of 800 MHz-1 GHz. In that case, a small clock jitter may distort the duty cycle. Therefore, it may be preferable to utilize a reference clock frequency with 50% duty cycle. Furthermore, it is observed that the DLL 48 may be designed to be free from stability considerations, unless the feedback delay is extremely large.

The foregoing describes a methodology to devise an analog delay locked loop (DLL) or phase locked loop (PLL) wherein the delay stages may be programmed according to the operating condition, which may depend on the frequency of the input reference clock. The resulting optimized delay stages allow for broad frequency range of operation, fast locking time over a wide range of input clock frequencies, and a lower current consumption at high clock frequencies. Better performance is achieved by allowing the number of analog delay stages active during a given operation to be flexibly set. The deactivation or turning off of unused delay stages conserves power at higher frequencies. The high frequency range of operation is increased because of the removal of the prior art restriction of using a fixed number of delay stages for all input clock frequencies.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating a synchronous circuit having a voltage controlled delay line with a plurality of delay stages, said method comprising:

applying a reference clock as an input to said voltage controlled delay line;

obtaining a plurality of output signals at an output of said voltage controlled delay line, each of the plurality of output signals having a different phase;

checking a relationship between the frequency of said reference clock and a portion of said plurality of output signals to determine a number of delay stages that is optimized for said reference clock; and controlling the number of active delay stages in response to said checking.

2. The method of claim 1, wherein said controlling includes turning off delay stages that are not optimized for said reference clock.

3. The method of claim 1, wherein said controlling includes generating an enable signal corresponding to each delay stage in said plurality of delay stages.

4. The method of claim 1, wherein the number of active delay stages to accommodate said reference clock is less than the number of active delay stages to accommodate a second reference clock, where a frequency of said reference clock is greater than a frequency of said second reference clock.

5. The method of claim 1, wherein applying said reference clock includes applying said reference clock to each delay stage in said plurality of delay stages.

6. The method of claim 1, wherein said obtaining said plurality of output signals includes obtaining a different one of said plurality of output signals at a corresponding output of a different one of said plurality of delay stages.

7. The method of claim 1, wherein said plurality of output signals, are delayed versions of said reference clock.

8. A method of operating a synchronous circuit having a voltage controlled delay line with a plurality of delay stages, said method comprising:

applying a reference clock as an input to said voltage controlled delay line;

obtaining a plurality of output signals at an output of said voltage controlled delay line;

checking a relationship between the frequency of said reference clock, and at least a selected one of said plurality of output signals to determine a number of delay stages that is optimized for said reference clock;

adjusting the amount of delay within a range of delays that each delay stage in said plurality of delay stages provides; and controlling the number of active delay stages in response to said checking.

9. The method of claim 8, wherein said controlling includes turning off delay stages that are not optimized for said reference clock.

10. The method of claim 8, wherein said controlling includes generating an enable signal corresponding to each delay stage in said plurality of delay stages.

11. The method of claim 8, wherein applying said reference clock includes applying said reference clock to each delay stage in said plurality of delay stages.

12. The method of claim 8, wherein said obtaining said plurality of output signals includes obtaining a different one of said plurality of output signals at a corresponding output of a different one of said plurality of delay stages.

13. The method of claim 8, wherein said plurality of output signals are delayed versions of said reference clock.

14. The method of claim 8 wherein said adjusting the amount of delay includes adjusting the amount of delay from between 300 ps and 700 ps.

* * * * *

UNITED STATES PATENT AND TRADEMARK OFFICE

CERTIFICATE OF CORRECTION

PATENT NO. : 7,835,205 B2
APPLICATION NO. : 12/252618
DATED : November 16, 2010
INVENTOR(S) : Kang Yong Kim et al.

It is certified that error appears in the above-identified patent and that said Letters Patent is hereby corrected as shown below:

In column 1, line 11, after "DLL/PLL"" insert -- , --.

In column 14, line 31, in Claim 7, delete "signals," and insert -- signals --, therefor.

Signed and Sealed this
Fourth Day of January, 2011

David J. Kappos
*Director of the United States Patent and Trademark Office*